(12) United States Patent
Bluzer

(10) Patent No.: US 9,029,750 B1
(45) Date of Patent: May 12, 2015

(54) CMOS AND CCD SENSOR R/O WITH HIGH GAIN AND NO KTC NOISE

(75) Inventor: Nathan Bluzer, Rockville, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 953 days.

(21) Appl. No.: 13/196,603

(22) Filed: Aug. 2, 2011

(51) Int. Cl.
*H01L 27/04* (2006.01)
*H01L 29/78* (2006.01)
*H01L 27/02* (2006.01)

(52) U.S. Cl.
CPC ............ *H01L 27/04* (2013.01); *H01L 27/0251* (2013.01)

(58) Field of Classification Search
CPC . H01L 27/0218; H01L 27/0251; H01L 27/04; H01L 29/7832; H01L 29/7834
See application file for complete search history.

(56) References Cited

U.S. PATENT DOCUMENTS

| | | |
|---|---|---|
| 3,781,574 A | 12/1973 | White et al. |
| 4,559,638 A | 12/1985 | Bluzer |
| 4,672,645 A | 6/1987 | Bluzer et al. |
| 4,727,403 A * | 2/1988 | Hida et al. ............... 257/194 |
| 5,343,297 A | 8/1994 | Tiemann et al. |
| 5,537,146 A | 7/1996 | Tohyama |
| 5,708,290 A * | 1/1998 | Cacciola et al. ............ 257/500 |
| 6,380,528 B1 | 4/2002 | Pyyhtia et al. |
| 2005/0051808 A1 | 3/2005 | Hynecek |
| 2007/0075338 A1 | 4/2007 | Park et al. |
| 2008/0105944 A1 | 5/2008 | Chang et al. |
| 2008/0211940 A1 | 9/2008 | Hynecek |
| 2008/0225140 A1 | 9/2008 | Raynor et al. |

FOREIGN PATENT DOCUMENTS

JP 05199463 8/1993

OTHER PUBLICATIONS

W. S. Boyle and G. E. Smith, "Charge Coupled Semiconductor Devices," Bell Syst. Tech. J., vol. 49, pp. 587-593, 1970.
G. F. Amelio, M. F. Tompsett, and G. E. Smith, "Experimental Verification of Charge Coupled Device Concept," pp. 593-600, 1970.
M. F. Tompsett, G. F. Amelio, and G. E. Smith, "Charge Coupled 8-Bit Shift Register," Appl. Physics Lett., vol. 17, pp. 111-115,1970.

(Continued)

*Primary Examiner* — Georgia Y Epps
*Assistant Examiner* — Don Williams
(74) *Attorney, Agent, or Firm* — Marsteller & Associates, P.C.

(57) ABSTRACT

A high sensitivity, high speed, and low noise, semiconductor non-destructive read-out (NDRO) device (700) for the conversion of a generated signal charge (110) into an output voltage having provisions for charge integration, charge transfer, and nondestructive charge read-out without kTC reset noise. The read-out device (700) includes charge sensing potential wells (520), a MOSFET having a gate (705), a source (145), and a drain (720), a feedback amplifier (305), a current generator (310), a reset gate (650), a reset drain (530), a multiplexer gate (820), and a pair of adjacent CCD transfer gates (750 and 760). CMOS detector pixels with this NDRO form a compact structure for integrating generated charge, and high sensitivity readout, without kTC reset noise. The NDRO in CCD devices provides a fast sensitive charge to voltage transducer without kTC reset noise. Connecting several NDRO stages in series (1000) provides multiple readout of a pixel to further improve sensitivity and performance of charge to voltage transduction.

60 Claims, 10 Drawing Sheets

(56) References Cited

OTHER PUBLICATIONS

C. H. Sequin and M. F. Tompsett, Charge Transfer Devices, Academic Press, New York, 1975, title page, frontispiece, table of contents, pp. 52-58.

D. F. Barbe, "Imaging Devices Using the Charge-Coupled Concept," Proc. IEEE, vol. 63, pp. 38-67, 1975.

A. J. Steckl and T. Koehler, "Theoretical Analysis of Directly Coupled 8-12•mHybrid IRCCD Serial Scanning (U)," Proc. CCD Applications Conf., pp. 247-258, San Diego, CA, Sep. 1973.

D. M. Erb and K. Nummendal, "Buried Channel CCD's for IR Applications," Proc. CCD Applicaitons Conf., pp. 157-167, San Diego, CA, Sep. 1973.

A. J. Steckl, R. D. Nelson, B.T. French, R. A. Gudmundsen, and D. Schecter, "Applications of Charge Coupled Devices to IR Detection and Imaging," Proc. IEEE, vol. 63, No. 1, pp. 67-74, 1975.

L.L. Thompson, D. H. McCann, R. A. Tracy, F. J. Kub, and M. H. White, "Time-Delay-and-Integration Charge-Coupled Device Using Tin Oxide Gate Technology," IEEE Trans. on Elect. Devices, vol. ED-25, No. 2, pp. 132-134, 1978.

S. Ochi, S. Yamanaka, Y. Kanoh, and T. Nishimura, "A Device Structure and Spatial Spectrum for Checker-Pattern CCD Color Camara," IEEE Trans. on Elect. Devices, vol. ED-25, No. 2, pp. 261-266, 1978.

N. Bluzer, D. McCann, S. Narayanan, and J. Wohlgemuth, "Quantum Photoelectronic Devices," Chapter 10 in: Active Electronic Components Handbook, Editors in Chief, Charles A. Harper and Harold C. Jones (McGraw-Hill, New York), 1976, title page, table of contents, pp. 10.1-10.59.

N. Bluzer, and R. Stehlik, "Buffered Direct Injection of Photocurrents into Charge Coupled Devices," IEEE Trans. Electron Devices, vol. ED-25, No. 2, pp. 160-166, 1978.

N. Bluzer, and A. S. Jensen, "Current Readout of Infrared Detectors," Optical Engineering, vol. 26, pp. 241-248, 1987.

W. F. Kosonocky, and J. E. Carnes, "Two Phase Charge—Coupled Devices with Overlapping Polysilicon and Aluminum Gates," RCA Review, vol. 34, pp. 164-202, 1973.

W. F. Kosonocky, and J. E. Carnes, "Design and Performance of Two Phase Charge-Coupled Devices with Overlapping Polysilicon and Aluminum Gates," Proc. International Electron Device Meeting, pp. 123-125, Washington, 1973.

Y. Matsunaga et al., "A High Sensitivity Output Amplifier for CCD Image Sensor," Tch. Digest, International Electron Device Meeting, pp. 116-119, Washington, Dec. 1987.

Y. Matsunaga, H. Yamashita, and S. Ohsawa, "A Highly Sensitive On-Chip Charge Detector for CCD Area Image Sensor," IEEE J. Solid State Circuits, vol. 26, No. 4, pp. 652-656, 1991.

M. H. White, D. R. Lampe, F. C. Blaha, and I. A. Mack, "Characterization of Surface Channel CCD Image Arrays at Low Light Levels," IEEE J. Solid-State Circuits, vol. SC-9, pp. 1-13, 1974.

G. F. Amelio, "The Impact of Large CCD Image Sensing Area Arrays," Proc. CCD74 International Conf., pp. 133-152, Edinburgh, 1974.

T. Matsumoto, R. Hyuga, and A. Yusa, "A New MOS Image Sensor Operating in a Non-Destructive Readout Mode," Tech. Digest, International Electron Device Meeting, pp. 353-356, Washington DC, 1986.

* cited by examiner

CMOS AND CCD SENSOR R/O WITH HIGH GAIN AND NO KTC NOISE

BACKGROUND OF THE INVENTION

1. Technical Field

The invention relates to the field of solid state image sensors, and more particularly to CMOS and CCD image sensor generated carrier to voltage conversion with high sensitivity and no kTC noise generation.

2. Background Art

Silicon based solid state CMOS and Charge Coupled Device (CCD) image sensors are particularly suitable for imaging in the visible spectrum. These image sensors are based on monolithic focal plane arrays which may have up to 100 million densely packed photodetectors, and a read-out multiplexer. The detector array samples the image by segmenting it into a two dimensional array of analog samples, where each photodetector provides an analog charge signal (or sample) proportional to the optical signals received by the photodetector. This arrangement yields a two dimensional densely packed array of analog charge samples that are processed by a CMOS or CCD read-out multiplexer. In addition to the x-y photodetector address function, the multiplexer converts the generated analog charge signal into a voltage. This charge-to-voltage read-out transduction is a very important operation for it determines the sensor's sensitivity, and operating speed. Accordingly, much attention is given to transduction of photons from the scene into analog voltage signals. The transduction process includes two steps: conversion of photons into charges, and conversion of charges into analog output voltage signal. With silicon, converting photons into charge signal is done directly by interband electron-hole excitation. This conversion process is a very efficient, low noise, and high speed process, and it alleviates the need for electrical injection of photosignals into CCD or CMOS devices. Conversion of generated charges into output voltage signal is more difficult and has a major impact on the imager's performance. Similarly, CCD signal, processors need transducers to convert charge signals to analog output voltages. Consequently, whether the charge signals are generated by photons or an electrical circuit, much attention has been focused on optimizing the charge-to-voltage read-out structures.

Conventional charge-to-voltage read-out circuits fall into two broad categories: destructive read-out and non-destructive read-out (NDRO). Destructive charge read-out uses a Field-Effect-Transistor (FET) to convert the charge to a voltage signal and is used with both CMOS and CCD imagers. The approach is to deposit directly, or indirectly, the signal charge on a precharged floating diffusion that is part of a p/n junction. The charge changes the DC potential of the diffusion and a FET gate is used to sense this change. Read-out of many charge signals, with the same structure, is achieved by resetting the floating diffusion after each read-out operation. The approach for destructive read-out for a CMOS imager is the same as is used in a CCD. However the CCD's destructive read-out also incorporates charge transfer. A disadvantage of the destructive charge read-out method is that charging and discharging the FET gate's capacitance for read-out gives rise to kTC reset noise. The kTC reset noise is removed using the Correlated-Double-Sampling (CDS) technique and this has significantly improved the performance of destructive charge read-out. However, the inclusion of CDS circuits in the imaging system adds complexity and the technique is particularly difficult to apply at high frequencies. An advantage of the destructive charge read-out structure is the relative ease of fabrication that utilizes existing CCD and CMOS imager semiconductor processing technology.

In the NDRO approach, the charge signal inside a potential well is sensed electrostatically. The NDRO does not have kTC reset noise since the charge sensed is in a potential well and not on a capacitor's plate. Removal of the charge after sensing is by clocking the potential well wherein the charge resides. Clocking the potential well is different than removing charge present on a capacitor plate with a reset switch. In conventional destructive readout structures, removing charge from a capacitor's plate is with a rest switch and the switches' resistance gives rise, to kTC reset noise. NDRO charge read-out circuits remove charge after sensing by clocking potential wells, and are more compact than destructive charge read-out circuits. Early mechanization of NDRO's (see FIG. 1A) was with floating gate 109 incorporated within the CCD clocking gates. The floating gate's potential $V_{FG}$, changes as signal charge $Q_{CCD}$ is transported below and within the CCD channel. Changes in the floating gate's potential $\delta V_{FG}$ is related to the signal charge $Q_{CCD}$ by, $$\delta V_{FG} = \frac{Q_{CCD}}{C_1 \left(1 + \frac{C_{CN}}{C_1} + \frac{C_{CN}}{C_2}\right)} \quad (1)$$

where $C_1$ is the capacitance between the floating gate 109 and the CCD clocking gate; $C_2$ is the capacitance between the floating gate and the charge packet 110; and $C_{CN}$ is the capacitance between the charge packet and the CCD substrate. Making $C_{CN} \ll (C_1$ and $C_2)$ maximizes the voltage signal $\delta V_{FG}$, for a given charge signal $Q_{CCD}$. A significant advantage of this NDRO structure is the elimination of "kTC" reset noise. The NDRO structure's output varies with the charge $Q_{CCD}$, and this charge is moved with CCD clocking gates. The signal charge $Q_{CCD}$ is completely removed, from under the floating gate 109, by manipulating the CCD potential wells, and this corresponds to a complete reset of the NDRO. This is unlike the reset of a capacitor through a switch with on resistance, which leaves a $(kT/C)^{1/2}$ reset noise voltage on the capacitor. In the NDRO, the signal charge $Q_{CCD}$ is completely removed by the CCD charge transfer thereby eliminating kTC reset noise. Noise wise this is a significant performance advantage. However, there are several disadvantages with this NDRO approach. First, limited shielding allows electrical coupling between the clock pulses, operating the CCD gates, and the floating gate 109, causing a corruption of the NDRO's output, signals. Second, this structure is difficult to fabricate, and the DC potential of the floating gate 109 is difficult to control. Controlling the potential of the floating gate is the most serious issue. It may be controlled by periodic reset of the floating gate. However, reset will introduce kTC reset noise thereby eliminating a major advantage to this specific NDRO approach. Instead of periodic reset, a very large resistor can be used to control the MIS gate's potential. However, it is very difficult to incorporate very large resistors into the CCD fabrication process.

The gate's 109 potential problems can be circumvented by replacing the floating gate with a FET that is built directly into the CCD channel. Incorporating a depletion mode FET into the CCD channel (see FIG. 1B) eliminates the floating gate issues and several associated problems. Charge sensing is produced by changes in the depletion width between the CCD channel and the FET. As the generated charge packet $Q_{CCD}$ increases, the depletion width decreases, making the FET more conductive. This sensing effect is analogous to using a back gate to modulate the FET. It should be evident that replacing the depletion mode FET by a surface channel device (see FIG. 1C) will also sense $Q_{CCD}$ in the CCD channel. However, with a surface channel FET, the coupling to the CCD charge is very poor resulting in low charge-to-voltage conversion gain. A close proximity between the NDRO surface channel FET and the CCD signal charge should reduce the effects of fixed pattern noise due to electrical feedthroughs. The benefits offered with the prior art NDRO structures are mitigated by increased fabrication difficulties and issues related to the NDRO's transfer function, which converts the signal charge to a voltage signal. With the invention of CDS, the NDRO's advantage has been reduced and destructive CCD read-out structures, using a floating diffusion, have gained dominance.

It is therefore desirable to provide an NDRO structure capable of high sensitivity charge-to-voltage read-out, no kTC read-out noise, and a simplified fabrication that utilizes existing CCD and CMOS imager semiconductor processing technology. It should be noted that while a number of noteworthy advances and technological improvements have been achieved within the art of CCD and CMOS charge-to-voltage read-out circuits, none completely fulfill the specific objectives achieved by this invention.

DISCLOSURE OF INVENTION

In accordance with the present invention, a high sensitivity, high speed, and low noise, semiconductor non-destructive read-out device for the conversion of a generated signal charge into an output. The non-destructive read-out device comprises a semiconductor substrate having a first type of dopant, a semiconductor layer having a second type of dopant different from the first type of dopant and disposed on the semiconductor substrate, potential wells formed inside the semiconductor layer for integration and/or transfer of the signal charge, and potential wells formed inside the semiconductor layer for read-out and/or transfer of the signal charge. A MOSFET is formed in the top semiconductor layer having a gate defining the underlying potential well used for sensing the signal charge, a first type of dopant source, a first type of dopant drain, and a surface channel wherein a source to drain charge flow is used to sense the signal charge. A feedback amplifier with a gain of G, G being a selectable gain number preferably less than one, has an input connected to the MOSFET source and an output connected to the MOSFET gate. A current generator is connected in series with the MOSFET source. A second type of dopant reset drain formed in the top semiconductor layer. Signal charge can be directly generated inside the charge sensing potential well (see FIG. 6). After signal charge sensing, a reset gate enables removal of signal charge from the charge sensing potential well into a reset drain. Signal charge can also be transferred into the signal charge sensing potential well with CCD transfer gates and/or a multiplexer gate (see. FIG. 8). These gates are on a dielectric formed on top of the semiconductor layer with second dopant type. Reduction of readout noise is mechanized by connecting several NDRO structures in series (see FIG. 10) and performing multiple nondestructive signal charge readouts. Correlating "N" nondestructive signal charge readout outputs will improve the signal to noise ratio by $N^{1/2}$, since the outputs contain correlated signals and uncorrelated noise. During readout with multiple NDRO devices connected in series, after readout, signal charge is transferred from the first NDRO's charge sensing potential well into the second NDRO's charge sensing potential well where it is subsequently readout. After readout with all the series connected NDRO structures, each signal charge is drained from the last NDRO stage into a reset drain by the action of the reset gate. A description is provided of a high sensitivity, high speed, and low noise, semiconductor multiple stage non-destructive read-out device comprising an input stage, a selectable number of interior NDRO stages, and a reset stage, for the conversion of signal charge into an output voltage.

These and other objects, advantages and preferred features of this invention will be apparent from the following description taken with reference to the accompanying drawings, wherein is shown the preferred embodiments of the invention.

BRIEF DESCRIPTION OF DRAWINGS

A more particular description of the invention briefly summarized above is available from the exemplary embodiments illustrated in the drawing and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

MODE(S) FOR CARRYING OUT THE INVENTION

Figure 1A:
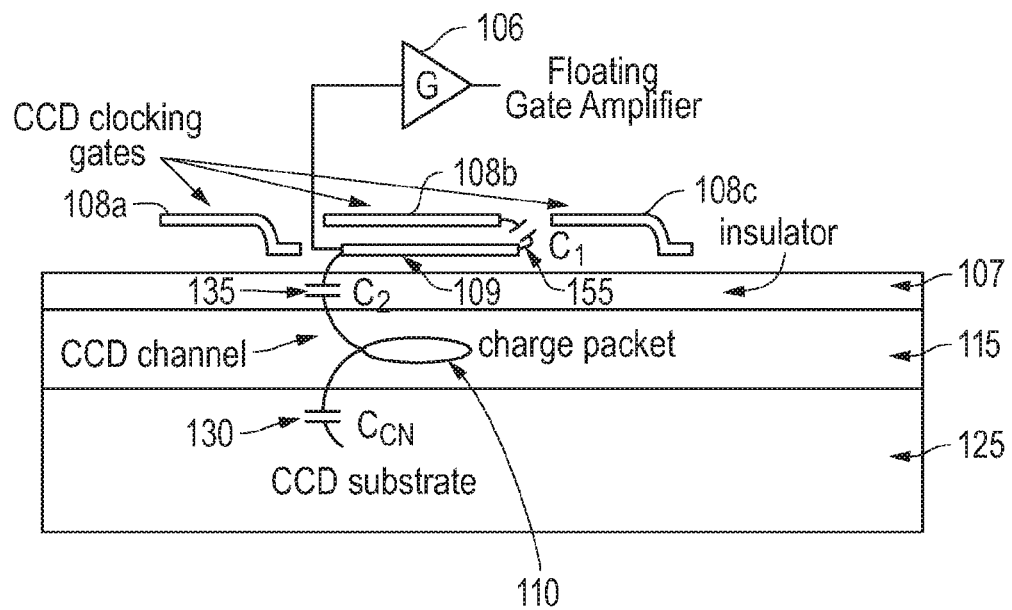
FIGS. 1A, 1B and 1C shows three schematics of prior art non-destructive read-out structures.

So that the manner in which the above recited features, advantages and objects of the present invention are attained can be understood in detail, more particular description of the invention, briefly summarized above, may be had by reference to the embodiment thereof that is illustrated in the appended drawings. In all the drawings, identical numbers represent the same elements.

The description below is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "forward," "rear," "front," "back," "up," "down," "top" and "bottom," as well as derivatives thereof, should be construed to refer to the orientation as then described or as shown in the drawing figure under discussion. These relative terms are for convenience of description and normally are not intended to require a particular orientation. Terms concerning attachments, coupling and the like, such as "connected" and "attached," refer to a relationship wherein structures are secured or attached to one another either directly or indirectly through intervening structures, as well as both movable or rigid attachments or relationships, unless expressly described otherwise.

In describing various embodiments, specific terminology is employed for the sake of clarity. However, the invention is not intended to be limited to the specific terminology so selected. It is to be understood that each specific element includes all technical equivalents which operate in a similar manner to accomplish a similar purpose.

Although certain embodiments of the CMOS and CCD sensor R/O with high gain and no kTC noise discussed below utilize a buried n-channel potential well for storing/transporting signal charge and a surface p-channel for sensing this signal charge for illustration purposes, a person of ordinary skill in the art will readily recognize that the CMOS and CCD sensor R/O with high gain and no kTC noise is not limited to this particular configuration, and may, in fact, utilize a buried p-channel potential well for storing/transporting signal charge and a surface n-channel for sensing this signal charge. Also, although certain embodiments of the CMOS and CCD sensor R/O with high gain and no kTC noise discussed below are applied to surface MOSFETs for illustration purposes, a person of ordinary skill in the art will readily recognize that they can be readily applied to buried MOSFETs or other types of FET devices without departing from the spirit of the invention. In addition, although particular aspects of the invention may be discussed in conjunction with only a CCD structure or only a CMOS structure for illustration purposes, a person of ordinary skill in the art will readily recognize that they can be readily applied to either structure, without departing from the spirit of the invention.

With reference now to FIG. 1 has three different exemplary prior art charge to voltage NDRO structures. FIG. 1A shows an electrode 109 placed inside a dielectric 107 and over the signal charge 110, located inside the buried channel 115. The signal charge 110 is electrostatically coupled, to electrode 109 through capacitance $C_2$, and is loaded by capacitors $C_1$ and $C_{CN}$. Electrode 109 is connected to a floating gate amplifier 106 which provides a voltage output proportional to the signal charge 110 sensed by electrode 109. Electrode 109 is subject to DC drift and electrical clocking transient from the CCD clocking gates 108a, 108b and 108c. These problems significantly limit the performance of this NDRO structure and are overcome by two prior art NDRO structures described below.

Figure 1C:
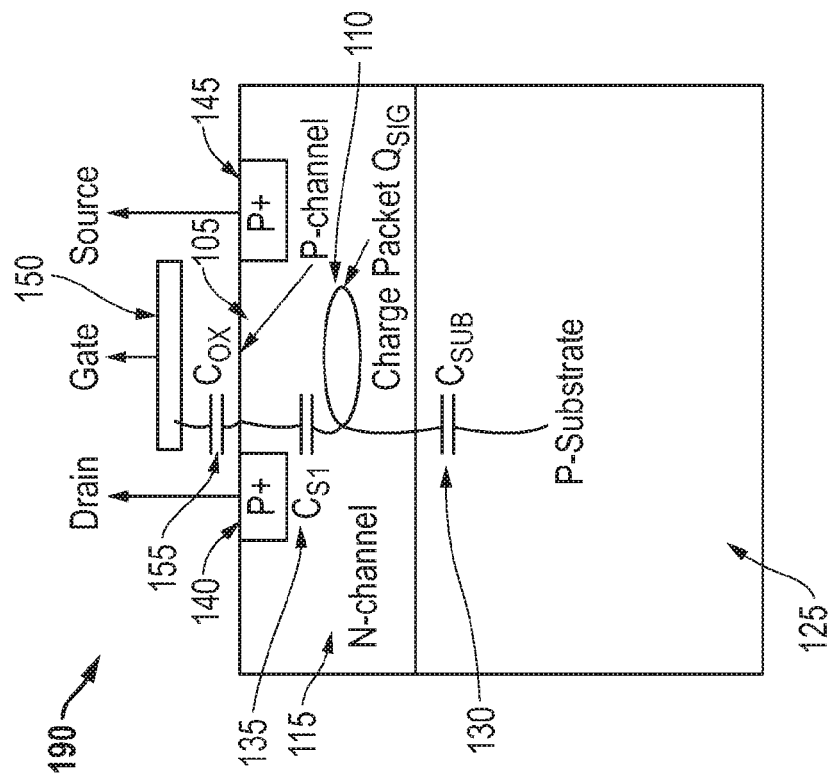
Figure 1B:
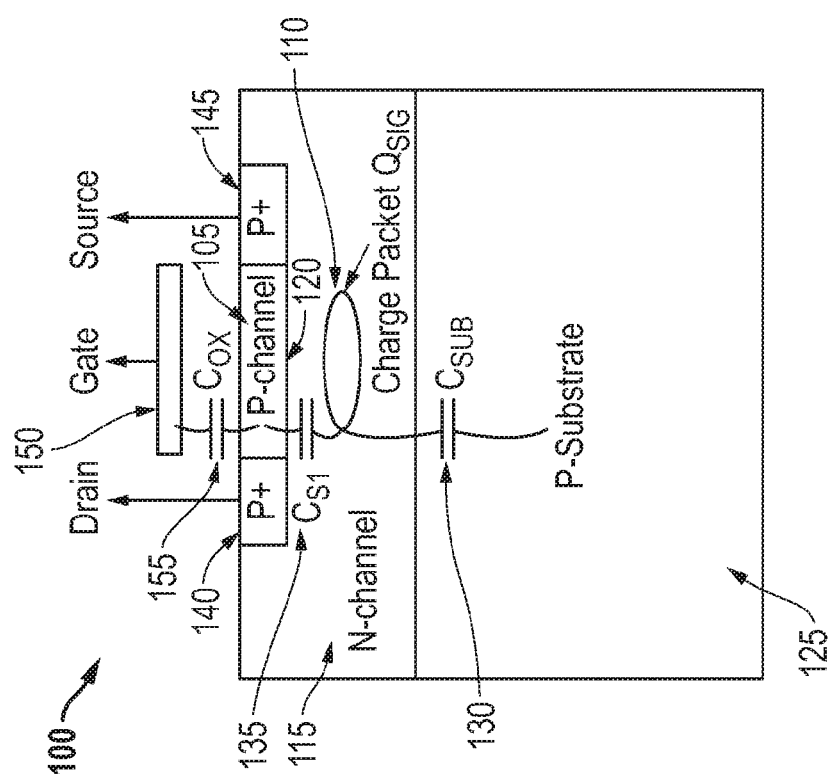

Shown in FIGS. 1B and 1C are exemplary, prior art charge-to-voltage NDRO structures with a buried p-MOSFET (Metal-Oxide-Semiconductor-FET) 100 (U.S. Pat. No. 4,672,645) having a p buried channel 105 and a surface p-MOSFET 190, having a p-surface channel 105. The charge packet $Q_{SIG}$ 110 is confined within a signal charge sensing potential well formed in buried N-channel region 115 and under sensing buried p-channel 120 of NDRO structure 100, and the sensing surface p-channel 105 of structure 190, where the channels are formed in the top layer of the buried N-channel region 115. The charge-to-voltage NDRO sensing structures 100 and 190 apply to CMOS and CCD imagers. In NDRO structure 100, nondestructive sensing is performed with a buried p-channel 120 by using the MOSFET's body effect. In NDRO structure 190, nondestructive sensing is performed with a surface p-channel 105 by using the MOSFET's body effect. The NDRO structures with a buried p-MOSFET 100 and a surface p-MOSFET 190 have a p-substrate 125 with a capacitance $C_{sub}$ 130, an N-channel region 115 with a capacitance 135, a MOSFET drain 140, a MOSFET source 145, and a MOSFET gate 150 with a gate capacitance 155. Fabrication issues and geometry aside, the same operation and analysis applies to charge-to-voltage conversion with a buried p-channel 120 or a surface p-channel 105.

Figure 2:
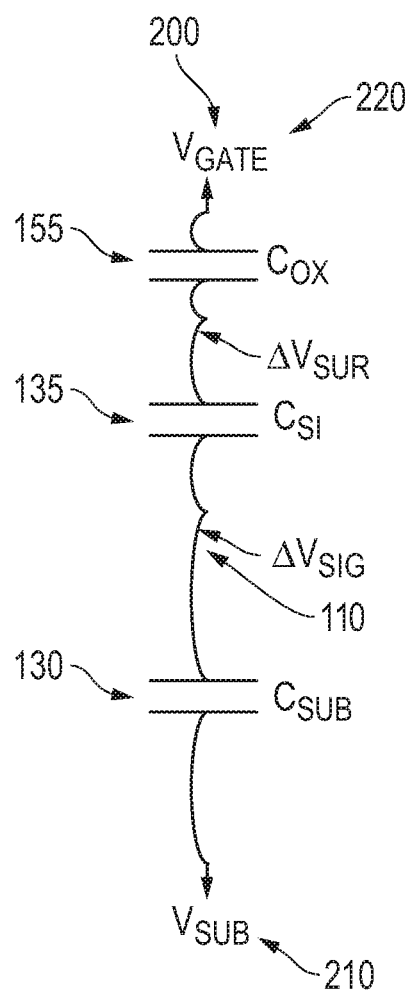
FIG. 2 is a circuit diagram of a prior art non-destructive read-out structure associated with the structure shown in FIG. 1C.

With reference now to FIG. 2, shown is a three capacitor circuit 200 representing the coupling between the P-MOSFET channel 105 potential and the charge packet 110. Charge packet $Q_{SIG}$ 110 affects the PMOS channel 105 potential in the P-MOSFETs 100 and 190 shown in FIGS. 1B and 1C. The three capacitor circuit 200 is used to compute changes in the PMOS channel 105 potential due to charge packet $Q_{SIG}$ 110. In these calculations $V_{SUB}$ 210 and $V_{GATE}$ 220 are treated as AC ground. Placing a charge packet QsiG 110 on the node between capacitors $C_{SUB}$ 130 and $C_{S1}$ 135 will change the signal charge node potential by ΔV, and this is related to $Q_{SIG}$ 110 by:

$$\Delta V = \frac{Q_{SIG}}{C_{SUB} + C_{OX}C_{SI}/(C_{OX} + C_{SI})} \quad (2)$$

The two capacitors $C_{OX}$ 155 and $C_{S1}$ 135 in series attenuate the ΔV charge in the charge packet's 110 node potential voltage. Accounting for this attenuation, the net change in the PMOS channel 105 potential due to the charge packet $Q_{SIG}$ 110 is given by:

$$\Delta V_{SUR} = \frac{Q_{SIG}C_{SI}}{C_{OX}C_{SUB} + C_{SI}C_{SUB} + C_{OX}C_{SI}} \cong \frac{Q_{SIG}}{C_{OX}} \quad (3)$$

The charge-to-voltage transformation with the prior art NDROs 100 and 190 depends on the capacitor ratio given in Equation (3). Since $C_{OX}$ 155>>[$C_{S1}$ 135, $C_{SUB}$ 130], the capacitor ratio in the center of Equation (3) is approximated on the right side as $1/C_{OX}$ 155. Hence, the FET's gate capacitance determines the charge-to-voltage conversion gain, and it equals to $1/C_{OX}$ 155. The charge-to-voltage gain with destructive read-out is smaller because FET's gate capacitance $C_{OX}$ 155 is in parallel with capacitances from floating diffusions, reset FET's diffusions, and the interconnect lines between them. With careful layout of destructive read-out these capacitance increases can be minimized thereby limiting the advantages of the NDRO circuit. Given the additional process complexity encountered with prior art NDRO, the tendency has been to make CMOS and CCD imagers with destructive read-out.

Figure 3:
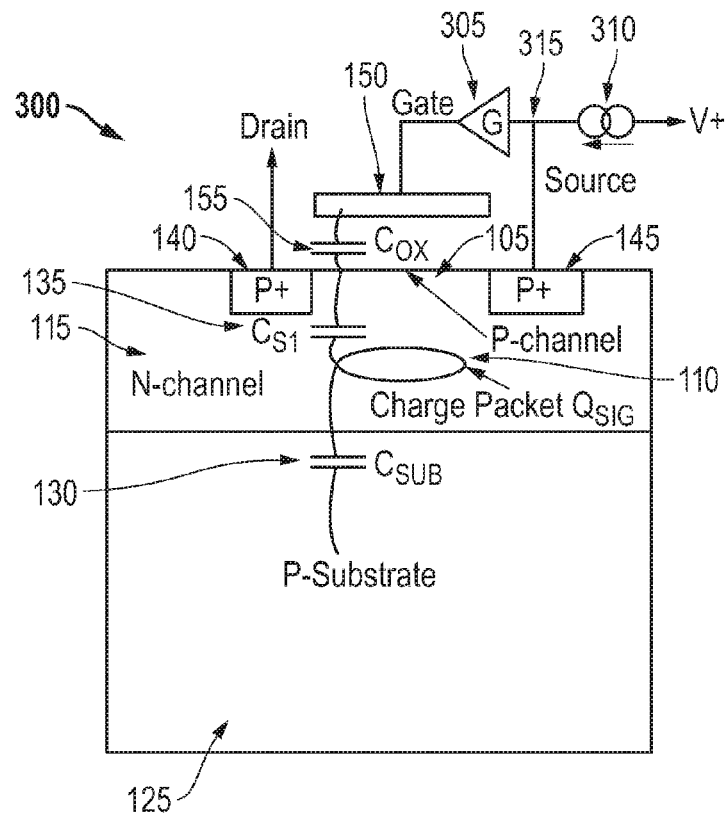
FIG. 3 is a schematic of a present invention the non-destructive read-out structure utilizing a feedback amplifier. Equivalent circuit elements are overlaid on the NDRO structure.

The NDRO of the present invention provides significant improvements in charge-to-voltage conversion gain (10×). For the NDRO structure 190 with the surface p-channel 105 of FIG. 1C, maximum conversion translates to maximizing changes in the surface p-channel 105 potential for a given $Q_{SIG}$ 110. For the NDRO structure 100 with the buried p-channel 120 of FIG. 1B, maximum conversion translates to maximizing changes in the buried p-channel 120 potential for a given $Q_{SIG}$ 110. With reference now to FIG. 3, maximizing charge-to-voltage gain is achieved by adding a feedback amplifier 305 with gain G. The amplifier 305 is connected between the P-MOSFET 300 NDRO's source output 145 and gate input 150. The NDRO P-MOSFET 300 operates in a source follower mode when a current generator 310 is connected in series with the P+ source 145. The amplifier's 305 gain G minimizes the charge packet's 110 effective node capacitance and maximizes coupling between $Q_{SIG}$ 110 and the P-MOSFET channel 105. The current generator 310 is connected to the amplifier 305 at the source follower node 315.

Figure 4:
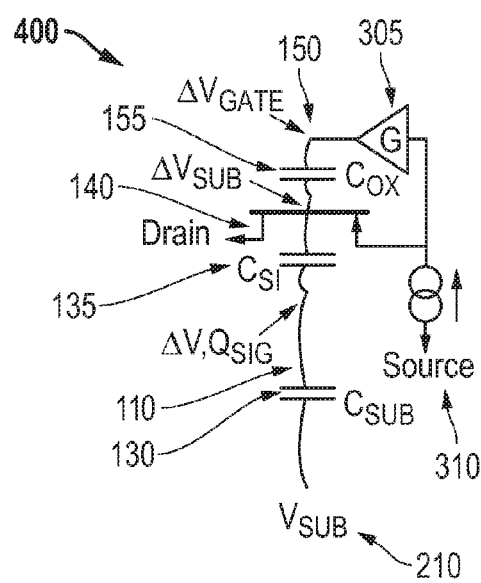
FIG. 4 is a circuit diagram of a present invention non-destructive read-out structure.

The gain of the NDRO structure 300 is analyzed with an equivalent circuit 400 shown in FIG. 4. The equivalent circuit 400 in FIG. 4 represents the surface channel P-MOSFET 300 and the feedback amplifier 305 with gain "G". The analysis of this read-out structure also applies for a buried channel P-MOSFET 100. The surface channel P-MOSFET 300 has two input ports: the front MOS gate 150, and a back gate due to the silicon body modulation with the charge packet. $Q_{SIG}$ 110. The front MOS gate 150 is driven by the feedback amplifier 305 with gain "G", connected to the source node 145. Charge packet $Q_{SIG}$ 110 modulates the surface potential by $\Delta V_{SUR}$, according to Equation 3 for no feedback. With feedback, charge $Q_{SIG}$ 110 modulates the surface potential by $\Delta V_{SUR}$ which changes, the voltage at the P-MOSFET source 145 node by $\Delta V_S$. The feedback amplifier 305 applies this voltage with a gain "G" to the P-MOSFET gate 150, and this gate voltage is given by, $$\Delta V_{GATE} = \left[\Delta V_{SUR} + \frac{\Delta V_{GATE}(1/C_{SUB} + 1/C_{Si})}{1/C_{OX} + 1/C_{SI} + 1/C_{SUB}}\right]G^* \quad (4)$$

The feedback amplifier's 305 gain "G" is modified to "G*" because of the source follower gain between the gate 150 input signal and source 145 output signal connected to the input node of the feedback amplifier 305. Grouping terms in Equation (5) results in a simplified expression and it is given by, $$\Delta V_{GATE} = \frac{\Delta V_{SUB} G^*}{\left[1 - \frac{C_{OX}(C_{SUB} + C_{Si})G^*}{C_{OX}C_{Si} + C_{SI}C_{SUB} + C_{Si}C_{SUB}}\right]} \quad (5)$$

The voltage applied to the P-MOSFET gate 150 by the feedback amplifier 305 is given by Equation 5, and this is related to the charge packet $Q_{SIG}$ 110 by replacing $\Delta V_{SUR}$ with the expression given by Equation 3. Performing this substitution and doing some rearranging of terms, an expression is obtained that relates the charge packet signal $Q_{SIG}$ 110 to the feedback amplifier's 305 output and it is given by, $$\Delta V_{GATE} = \frac{Q_{SIG}G^*}{C_{SUB} + C_{OX}(1 + C_{SUB}/C_{SI})(1 - G^*)} \cong \frac{Q_{SIG}}{C_{SUB}}\bigg|_{G^*=1} \quad (6)$$

Equation (6) illustrates that under ideal conditions "G*" should be made equal to one and, the charge to voltage conversion gain for the NDRO structure 300 is maximized. The increased gain is evident by comparing Equation 6 to Equation 3. The charge to voltage conversion gain for the NDRO structure 300 is (1/$C_{SUB}$ 130) and for a conventional NDRO is (1/$C_{OX}$ 155). The improvement in the charge-to-voltage conversion gain equals the capacitor ratio ($C_{OX}$ 155/$C_{SUB}$ 130) and this is given by, $$\text{Charge/Voltage Conversion Gain} = \frac{C_{OX}}{C_{SUB}} = \frac{\varepsilon_{Ox}}{\varepsilon_{Si}} \frac{d_{DEP}}{d_{OX}} \quad (7)$$

The substrate capacitance 130 is much smaller than the gate capacitance 155 because the gate 150 oxide thickness $d_{ox}$ (about 100 nm) is much less than the substrate depletion width $d_{dep}$ (about 10 μm). Including the dielectric constants for oxide $\varepsilon_{OX}$ and silicon $\varepsilon_{Si}$, the calculated gain improvement is 28.6. This is a very significant improvement and leads to improved sensitivity. For a 6 μm×6 μm NDRO 300 charge well, the estimated $C_{SUB}$ 130 capacitance will be about 3.8 fF. Such a low capacitance translates to a charge to voltage conversion gain of 0.42 μV for each electron. Such a large charge-to-voltage conversion gain will maximize sensitivity and this is particularly important for small pixel size imagers. For maximum sensitivity, the "G*" gain factor, in Equation 6, needs to equal one. If "G*" is equal to 0.99, then the attenuation of the deleterious effects of $C_{OX}$ 155 will be reduced by 100×. The value of "G*" is the product of the feedback amplifier 305 gain "G" and the P-MOSFET source 145 follower gain. Combining these gains, the explicit expression for "G*" is given by, $$G^* = G\frac{g_M + Z_D}{1 + g_M Z_D} \quad (8)$$

where $g_m$ is the P-MOSFET's 190 transconductance and $Z_D$ is the impedance of the current generator 310 connected to the source follower node 315. Realizing G* with a gain of 0.9999 is practical and thereby facilitating realization of the full potential of the NDRO structure 300, and it is described below.

Figure 5:
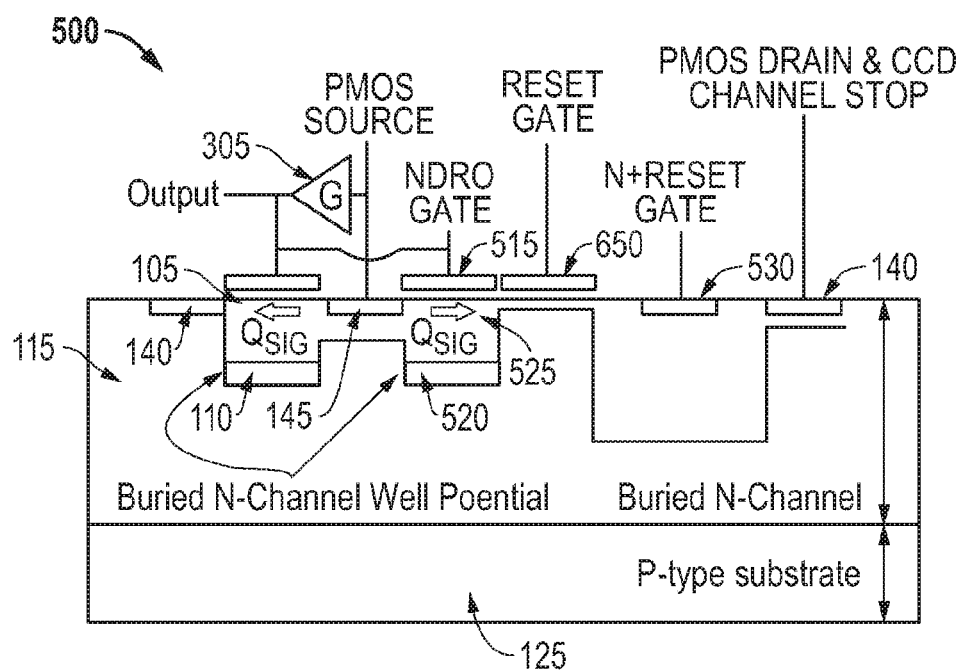
FIG. 5 is a cross-sectional schematic of a first embodiment non-destructive read-out structure wherein the signal charge is directly generated, in the NDRO structure. The current generator connected to the PMOS Source has been left out for clarity.
Figure 6A:
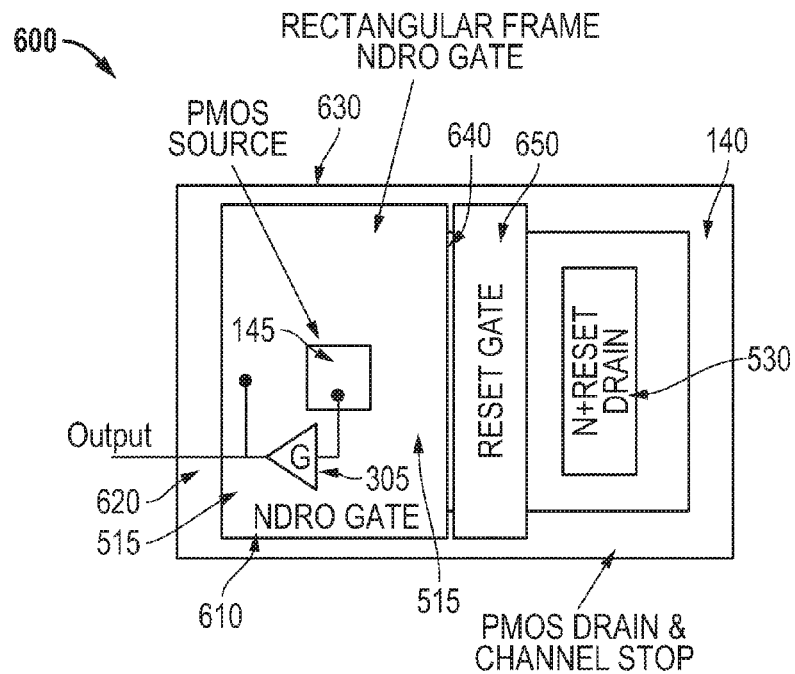
FIGS. 6A and 6B are, respectively, top view schematics of a first embodiment non-destructive read-out with rectangular and doughnut gate structures whose cross-section is shown in FIG. 5.
Figure 6B:
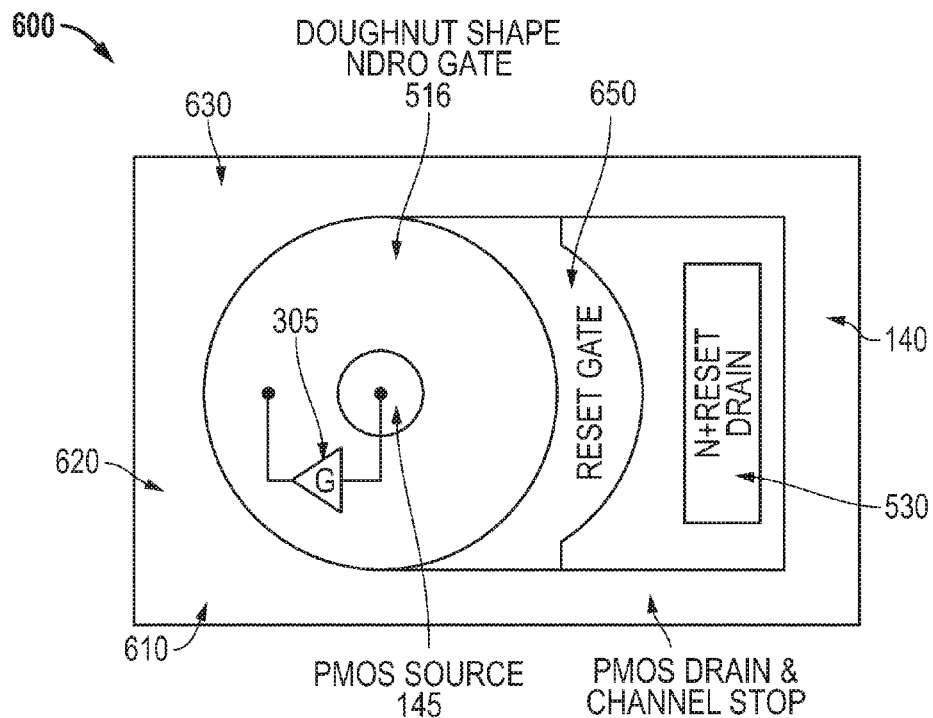

With reference now to FIG. 5, shown is a cross-section of an NDRO 500 appropriate for a CMOS imager that has provisions for optical injection of signal charge $Q_{SIG}$ 110. Photons incident through the NDRO gate 515 will generate electron-hole pairs and the electrons will be integrated in the buried channel signal charge sensing potential well 520 underneath the NDRO gate 515. Without loss of generality, we show an n-channel potential well 520 for integrating/storing/transporting signal charge $Q_{SIG}$ 110, and a p-MOSFET channel 105 for sensing this signal charge 110. Opposite polarity channels 105 and channel potential well 520 are required to maintain separation between the signal electrons $Q_{SIG}$ 110 and the p-MOSFET's holes, used to sense $Q_{SIG}$ 110. The flow of holes at the p-MOSFET surface channel 105 is represented by two arrows 525. The holes flow from source 145 to drain 140 (which also serves as a channel stop) and are in very close proximity to the electrons signal $Q_{SIG}$ 110. Using opposite polarity carriers for signal and sensing maximizes sensitivity since the signal charge and the p-MOSFET sensing channel 105 are arranged in tandem and very close to each other. During charge-to-voltage conversion (sensing), the signal electrons $Q_{SIG}$ 110 are confined within a charge sensing potential well 520, formed in buried n-channel 115. The potential well 520 is rectangular or oval with the center removed and wherein we form the source 145 of the sensing p-MOSFET 190. Thus, with reference to FIG. 6A, top view 600 of the NDRO 500, the signal, under a rectangular gate 515, $Q_{SIG}$ 110 is confined and distributed within a rectangular frame like charge sensing potential well 520. With reference to FIG. 6B, top view 600 of the NDRO 500, under the doughnut shape NDRO gate 516, the signal $Q_{SIG}$ 110 is confined and distributed within a doughnut shaped charge sensing potential well 520. P+ diffusions and surface inversion are used to confine $Q_{SIG}$ 110 within the charge sensing potential well 520. On three sides 610, 620, and 630 of the NDRO gate 515 the p-MOSFET P+ drain 140 overlaps the NDRO gate 515 and forms potential well barriers, and the fourth side 640 is controlled by the RESET GATE 650. The RESET GATE 650 dynamically controls the potential barrier on the fourth side 640. Unlike the static P+ potential barriers formed on three, sides 610, 620, and 630 of the NDRO gate 515, the potential barrier beneath the RESET GATE 650 can be opened or closed. Sufficient negative bias on the RESET GATE 650, the n-type surface will be inverted and pinned to the P+ DRAIN potential, and thereby form a potential barrier on all four sides 610, 620, 630, and 640 of the NDRO gate 515 that defines the underlying $Q_{SIG}$, 110 sensing potential well. Pulsing positive the RESET GATE 650, will dynamically remove the potential barrier and drain the signal $Q_{SIG}$ 110 into the N+ RESET DRAIN 530.

Figure 7:
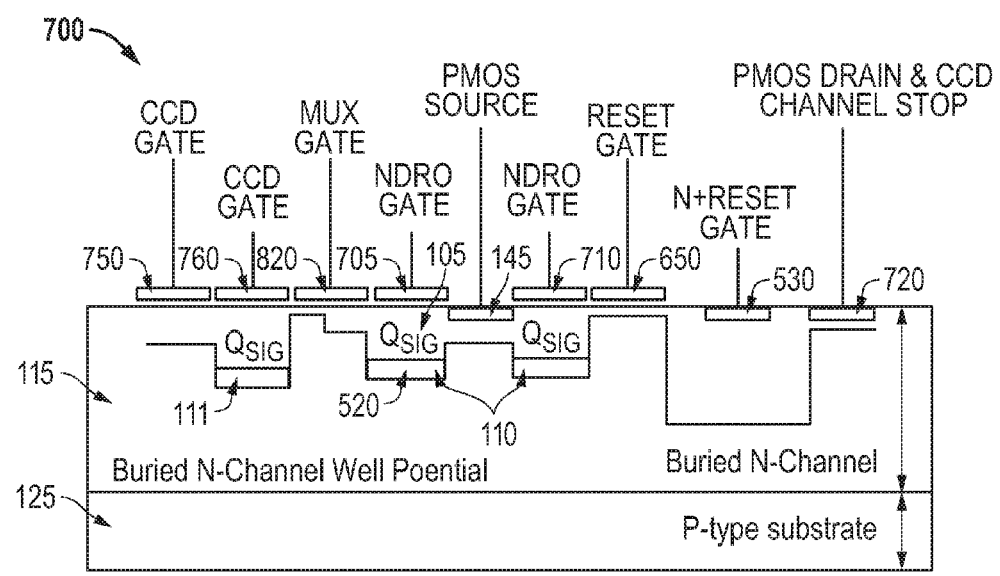
FIG. 7 is a cross-sectional schematic of a second embodiment non-destructive read-out structure where the signal charge is electrically injected in the NDRO with a CCD charge shift register.
Figure 8A:
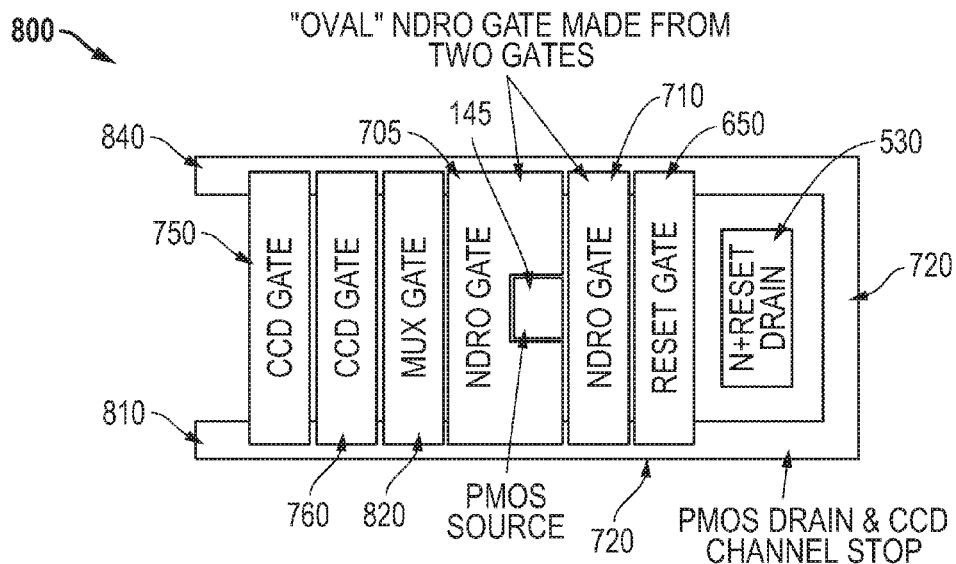
FIGS. 8A and 8B are, respectively, top'view schematics of a second embodiment non-destructive read-out with rectangular and doughnut gate structures whose cross-section is shown in FIG. 7.
Figure 8B:
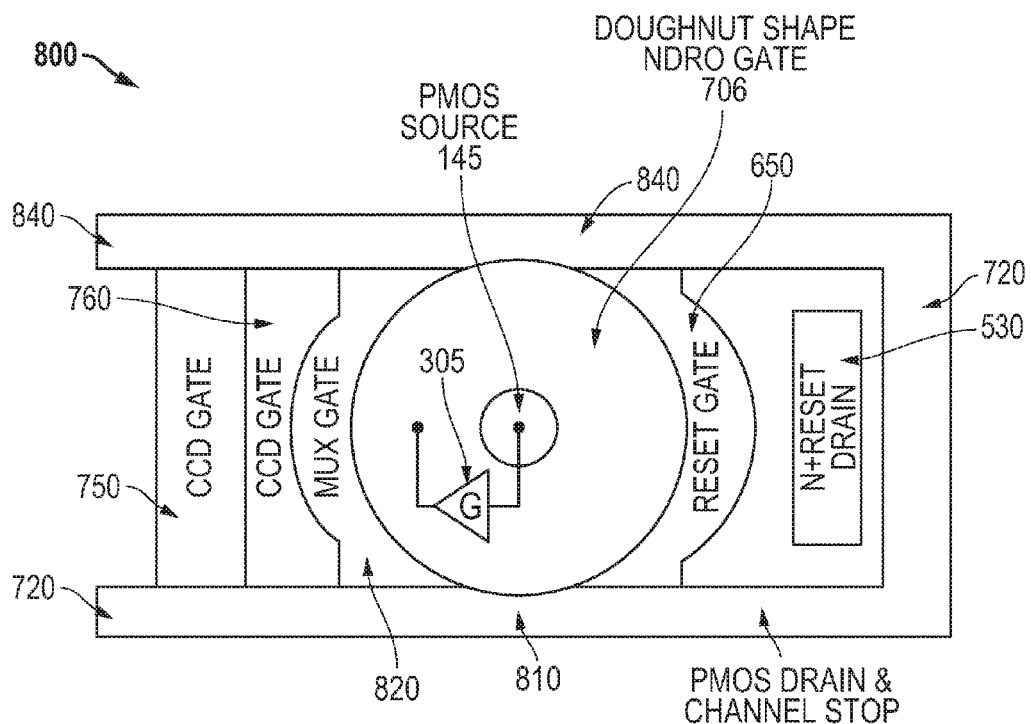

The NDRO structure 500 of FIG. 5 has been configured for optical signal injection and periodic reset through the N+ REST DRAIN 530. The NDRO structure 500 of FIG. 5 combines the read-out and integration regions into a single potential well 520. However, more complicated CMOS and CCD imagers have architectures where signal integration, transfer and read-out are performed at different locations. For such imaging devices more sophisticated read-out structures are needed. By incorporating several changes, the NDRO structure 500 of FIG. 5 is readily extended for use in modern imagers. The major change is to incorporate provisions for electrical injection of signal charge into the charge-to-voltage conversion well. With reference now to FIG. 7, a cross sectional view of an NDRO structure 700 with electrical injection is shown. The NDRO structure 700 charge reset portion remains the same as in the NDRO structure 500 of FIG. 5. Small changes are made to the charge-to-voltage sensing NDRO stage. The NDRO GATE 515 may be split into two sections, 705 and 710 to speed up charge removal needed for very high speed reset operation. For most applications, the single NDRO GATE 515 configuration, shown in the NDRO structure 500 of FIG. 5, is preferred over the dual NDRO GATE configuration 705 and 710, shown in FIG. 7. Electrical charge injection is incorporated in the NDRO structure 700 without negatively affecting the charge-to-voltage conversion performance. The p-MOSFET sensing channel 105 is arranged in tandem and in close proximity with the charge sensing potential well 520 storing electron charges $Q_{SIG}$ 110. Normally, combining NMOS electron (NMOS) with hole (PMOS) devices requires isolation wells with guard rings. PMOS (NMOS) devices are made in n-wells (p-wells) with N+ (P+) guard rings. The guard rings prevent parasitic surface transport between source and drain. The parasitic surface transport is facilitated by: surface interface states, fixed charge in the dielectric, and/or field inversion by interconnect lines. Since the NDRO structure 700 incorporates in tandem NMOS and PMOS devices, conventional guard rings cannot be used. PMOS (NMOS) guard rings made from N+ (P+) would create shorts between the NMOS (PMOS) source and drain. We solve the NDRO N+/P+ guard ring problem with a novel design. The NDRO structure's 700 need for N+ and P+ guard rings is eliminated by shaping the p-MOSFET 720 drain into a rectangular frame as shown in the top view 800, FIG. 8A, of NDRO structure 700. The rectangular P+ frame is located around a square NDRO gate 705 and 710, in FIG. 8A, or around a doughnut shape gate 706 in FIG. 8B, with P+ source 145 in the center, FIGS. 7, 8A, and 8B. Since there are no parasitic paths between the P+ source 145 and drain 720, the need for a N+ guard ring is eliminated. The NDRO's P+ drain 720 also doubles as the P+ guard ring (channel stop) for the $Q_{SIG}$ 110 n-channel charge sensing potential well 520. The need for reset and electrical injection of $Q_{SIG}$ 110 dictates a dynamic solution to the guard ring (channel stop) problem. Thus the drain 720 cannot be made from a P+ diffusion shaped like a rectangular frame. Instead, the P+ drain 720 is divided into two regions; region with segments top 840 and bottom 810, and region with segments left 820 and right 650. The PMOS drain 720 top 840 and bottom 810 segments are P+ diffusions that double as channel stops for $Q_{SIG}$ 110. The left 820 and right 650 PMOS drain segments are dynamic since they are formed by surface inversion when negative bias is, applied to the MUX GATE 820 and RESET GATE 650, FIG. 8A. Thus, surface inversion completes the P+ drain 720 around the NDRO GATE 705 and 710 by electrically connecting the dynamic left 820 and right 650 PMOS drain segments to static top 840 and bottom 810 channel stops segments. While the P+ drain completely surrounds the NDRO GATE 705 and 710, signal electrons $Q_{SIG}$ 110 are confined in the charge sensing potential well 520 formed below the NDRO GATE 705 and 710. Signal $Q_{SIG}$ 110 confinement continues while the MUX GATE 820 and RESET GATE 650 are biased into surface inversion.

Biasing the RESET GATE 650 out of inversion completely eliminates the potential barriers and $Q_{SIG}$ 110 electrons are drained into the N+ RESET drain 530. Once $Q_{SIG}$ 110 is drained, the RESET GATE 650 is again biased into inversion. A new $Q_{SIG}$ 110 is injected into the potential well 520 under the NDRO GATE by applying proper pulses to the CCD #1 GATE 750, CCD #2 GATE 760, and MUX GATE 820. With proper phasing, signal electrons $Q_{SIG}$ 110 are drained from, and injected into, the charge sensing potential well 520 located below the NDRO GATE 705 and 710.

Figure 9:
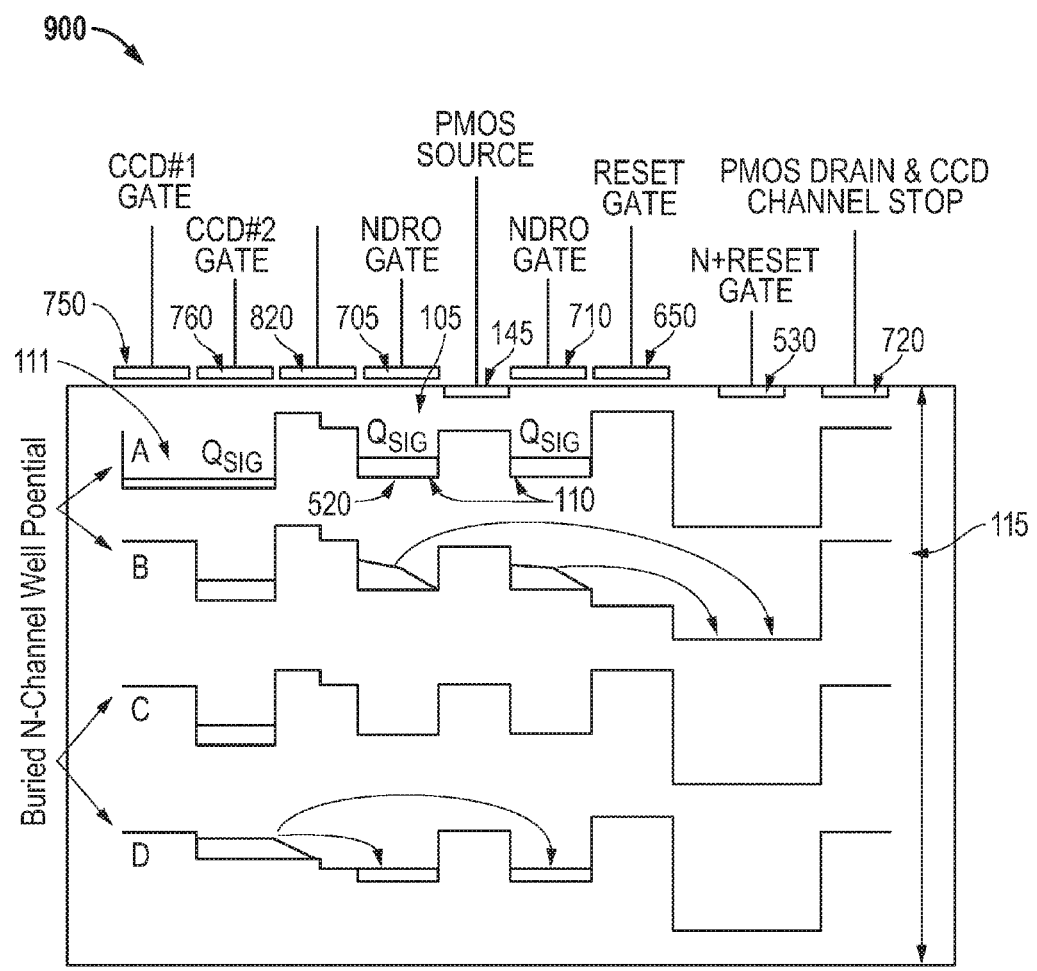
FIG. 9 is a cross-sectional operational schematic of a second embodiment non-destructive read-out structure. NDRO operation is represented by inserts A, B, C, and D. Insert A represents signal charge readout. Insert B represents draining signal charge from the charge sensing well into the reset drain. Insert C represents the NDRO state after the signal charge has been removed. Insert D represents injection of a new signal charge from the CCD into the NDRO signal charge sensing well.

Operation of the NDRO structure 700 is detailed in FIG. 9. Transfer of signal electrons 110 into and out of the NDRO structure 700 mechanizes charge-to-voltage conversion of many charge packets with a single non destructive read-out. With CMOS imagers, a single NDRO structure 500 is built into each pixel. With CCD, each NDRO structure 700 is used to read-out a large group of pixels. These application requires electrical injection into, and removal of, $Q_{SIG}$ 110 from the charge sensing potential well 520 under the NDRO GATE 705 and 710. The potentials needed for mechanizing this operation are inserts A, B, C, and D, illustrated in FIG. 9 for NDRO structure 900. The potentials in inserts A, B, C, and D, are produced by clocking waveforms which consist of analog pulses applied to MIS gates, including: CCD GATES 750 and 760, MUX GATES 820, NDRO GATES 705 and 710, and RESET GATES 650. Operation of the NDRO structure 900 is explained with the aid of the four potential diagrams [inserts A, B, C, and D], in FIG. 9 and potential configurations detailed in Table I. A DC current, DC voltages, and analog AC clock voltages are applied to the NDRO structure 900. The positive side of a DC current generator 310 (not shown) is attached to the p-MOSFET P+ source 145 node. The negative side of the DC current generator 310 is attached to a positive bias voltage V1. The p-MOSFET DRAIN 720, which also acts as the CCD channel stop, is attached to ground. The N+ RESET DRAIN 530, connected to the N-channel, is connected to a positive voltage V2 and this is equal to, or more positive, than V1. The p-type substrate 125 is connected to a negative voltage or ground, and is used to optimize the operation of the n-channel 115 CCD and the charge sensing potential wells under the NDRO GATE 705 and 710. The two NDRO GATE segments 705 and 710 are shorted together and driven by an amplifier 305 (not shown) with gain less than one. The "unity" gain amplifier's 305 input is connected to the P+ PMOS source 145 and its output to the NDRO GATE 705 and 710. The amplifier 305 combined with the NDRO's p-MOSFET (buried p-MOSFET 100 or surface p-MOSFET 190) form a feedback loop that minimizes the effective capacitance $Q_{SIG}$ 110 experiences. Minimizing the effective capacitance $Q_{SIG}$ 110 experiences is important for maximizing charge-to-voltage gain. The amplifier 305 also provides output drive. Additionally, the amplifier 305 includes provisions for adjusting DC offsets, used to optimize the DC bias conditions on the NDRO GATE 705 and 710. The amplifier's 305 second function is to provide output signal voltage drive for the NDRO structure 900.

Operation of the NDRO structure 900 is periodic since it repeats after cycling through the potential configurations represented by inserts A, B, C, and D in FIG. 9. The potential configuration state A is listed in the first line of Table I. Shown in cross section signal charge packet $Q_{SIG}$ 110, held inside a charge sensing potential well 520. The signal charge packet $Q_{SIG}$ 111 before injection into the sensing well 520 is held under CCD #1 GATE 750 and CCD #2 GATE 760. The second signal charge packet $Q_{SIG}$ 110 is held under the NDRO GATE 705 and 710. During state A, the RESET GATE 650 and MUX GATE 820 are operated in the surface inversion mode. Surface inversion completes a P+ drain frame that encloses the area around the NDRO GATE 705 and 710 and confines $Q_{SIG}$ 110 under the NDRO GATE 705 and 710. Signal charge $Q_{SIG}$ 110 is subjected to feedback and this minimizes the effective capacitance $Q_{SIG}$ 110 experiences and thereby maximizes the output signal. During state A, the NDRO structure 900 performs the high gain charge-to-voltage conversion.

formed by CCD #2 GATE 760. At the same time charge $Q_{SIG}$ 110, under the NDRO GATE 705 and 710, is drained into the N+ reset drain 530. Draining charge $Q_{SIG}$ 110 from the charge sensing potential well 520 formed under the NDRO GATE 705 and 710 is a charge transfer process. This is very important since no kTC reset noise is associated with a reset operation using potential wells for charge transfer. Preventing kTC reset noise has a tremendous integration advantage, since a CDS circuit with a large capacitor is not required inside every pixel. Thus the pixels can be made significantly smaller.

After draining the charge $Q_{SIG}$ 110 into the N+ DRAIN 530, the NDRO structure 900 is biased into state C (see Table I). In state C the RESET GATE 650 is again biased into the surface inversion mode, leaving the charge sensing potential well 520 under the NDRO gate 705 and 710 empty and surrounded by a potential barrier formed by the p-MOSFET drain 720. After reforming the potential well 520 under the NDRO GATE 705 and 710 for $Q_{SIG}$ 111, the NDRO structure 900 is biased into state D. In state D the MUX GATE 820 is opened (made non-blocking) and the CCD #2 GATE 760 is made repulsive. This causes the charge $Q_{SIG}$ 111 to be transferred into the potential well 520 formed under the NDRO GATE 705 and 710. Following this transfer, the NDRO structure 900 is returned into state A and the whole process repeats.

Figure 10:
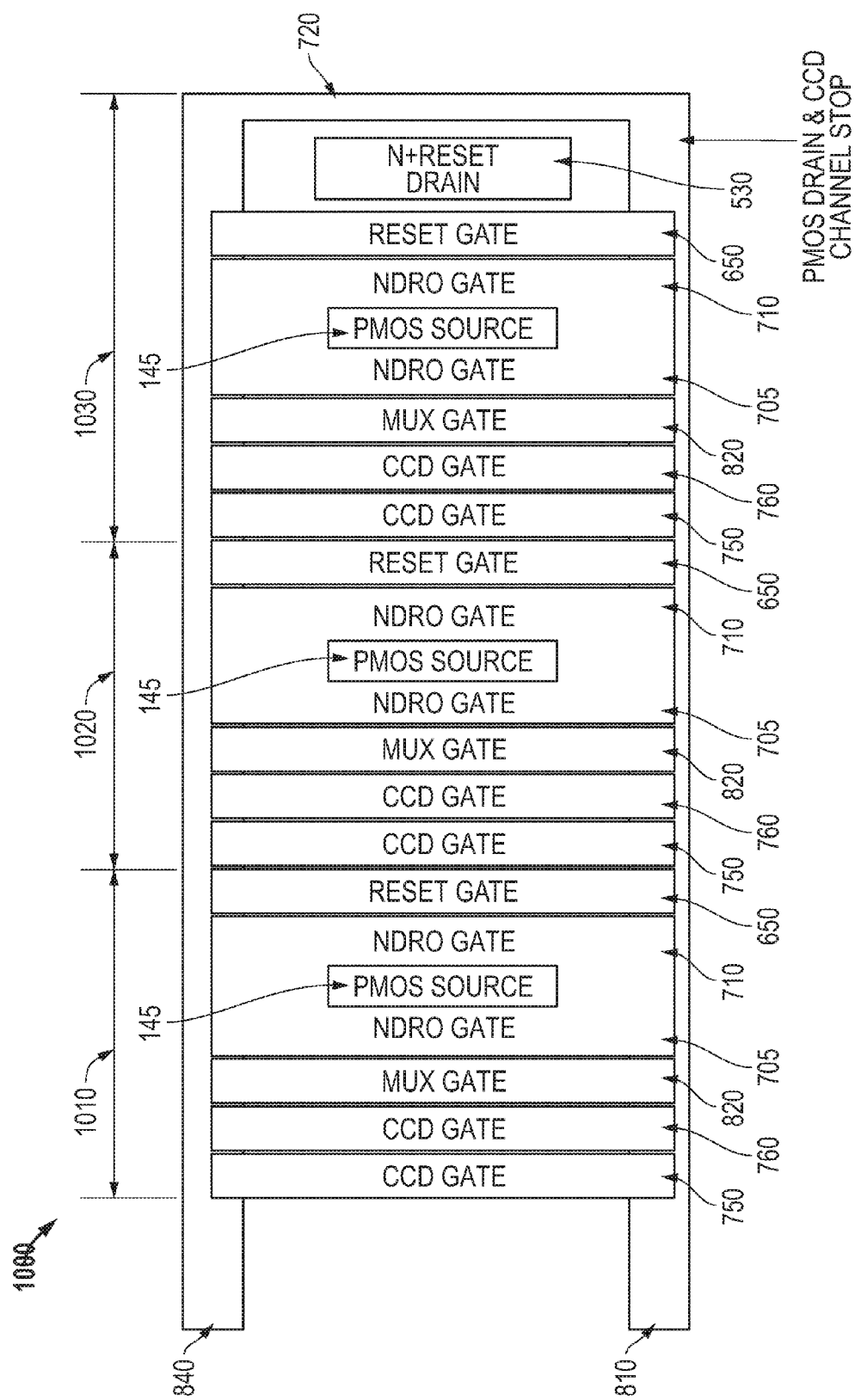
FIG. 10 is a top view schematic of a multi-stage non-destructive read-out structure, consisting of three NDRO stages. On the left, signal charge is injected from a CCD and removed after readout with three NDRO stages into a reset drain located on the right side.

With some modifications, several modified NDRO structures similar to NDRO structure 800 can be connected in series. An exemplary series NDRO structure 1000 shown in FIG. 10 consists of three NDRO stages: input type NDRO 1010, interior type NDRO 1020, and end type NDRO 1030. The end type NDRO 1030 will include the N+ RESET DRAIN 530. The interior type NDRO 1020 will not have an N+ RESET DRAIN 530, and it will be replaced by several CCD transfer gates 750 and 760. The input type NDRO 1010 will also not have an N+ RESET DRAIN 530 and the input portion will be the same as for the NDRO structure 800 shown in FIG. 8. The input NDRO 1010 and interior NDRO 1020 are similar and the difference facilitates connection to a charge source. Multiple non-destructive readout of a charge signal is mechanized by interconnecting in series NDRO stages 1010, 1020, and 1030. For two non-destructive readouts of a charge signal, NDRO 1010 and 1030 are connected in series. For three or more non-destructive readouts of a charge signal, an input type NDRO 1010, at least one interior type NDRO 1020, and an end type NDRO 1030 are connected in series, and this will allow repeated nondestructive sensing of charge $Q_{SIG}$ 110 trough the multiple NDRO stages. Combining (after proper delay) outputs from the NDRO stages 1010, 1020, and 1030, will provide means for signal/noise improvement. The signal/noise will improve with the square root of the number

TABLE 1

| | CCD#1 GATE | CCD#2 GATE | MUX GATE | PMOS SOURCE | NDRO GATE | RESET GATE | N+ DRAIN | PMOS DRAIN & CCD C/S |
|---|---|---|---|---|---|---|---|---|
| A | Opened | Attractive | Inverted | Current | Active | Inverted | DC2 Pos. | Ground |
| B | Blocking | Attractive | Inverted | Current | Inactive | Opened | DC2 Pos. | Ground |
| C | Blocking | Attractive | Inverted | Current | Inactive | Inverted | DC2 Pos. | Ground |
| D | Blocking | Repulsive | Opened | Current | Inactive | Inverted | DC2 Pos. | Ground |

In TABLE I potentials applied to the NDRO structure 900 are tabulated as a function of one of the four potential states A, B, C, and D, at which the NDRO structure 900 is biased during operation.

After read-out of the $Q_{SIG}$ 110 the NDRO structure 900 is biased into state B (see Table I). In state B, the reset gate 650 is opened (non-blocking) and CCD #1 GATE 750 is made repulsive. Charge $Q_{SIG}$ 111 is transferred to a potential well of NDRO stages interconnected in series. The improvement in signal/noise ratio is very important for low light level applications. Low light level applications strive for single photon sensitivity. Although the series NDRO structure 1000 consists of an input type NDRO 1010, an interior type NDRO 1020, and an end type NDRO 1030 for illustration purposes, a person of ordinary skill in the art will readily recognize that other combinations of stages, and series NDRO structures consisting of multiple interior type NDROs 1020 in series can be implemented without departing from the spirit of the invention. In series NDRO structure 1000 operation, charge signal $Q_{SIG}$ 110 is injected into the input type NDRO 1010. The interior type NDRO 1020 accepts the charge signal $Q_{SIG}$ 110 from the input type NDRO 1010 and injects charge signal $Q_{SIG}$ 110 to the end type NDRO 1030. The charge signal $Q_{SIG}$ 110 is read-out by the end type NDRO 1030 and subsequently destructively drained into the N+ RESET DRAIN 530. The length of the series NDRO structure 1000 can be adjusted by increasing the number of interior type NDRO 1020 stages. A feedback amplifier 305 is included with each NDRO stage to maximize charge-to-voltage conversion gain in each NDRO stage in structure 1000, but for reasons of clarity is not shown. The NDRO structures 500, 700, and 1000 are high sensitivity, low noise, and high speed structures for charge-to-voltage conversion and have applications in CMOS and CCD imaging sensors. Their fabrication process is compatible with semiconductor processes used for fabricating CMOS and/or CMOS imagers.

The foregoing disclosure and description of the invention are illustrative and explanatory thereof, and various changes in the size, shape and materials, as well as in the details of the illustrated construction may be made without departing from the spirit of the invention.

The invention claimed is:

1. A high sensitivity, high speed, and low noise, semiconductor non-destructive read-out device for the conversion of a generated signal charge into an output voltage, the non-destructive read-out device comprising:
   a semiconductor substrate having a first type of dopant;
   a semiconductor layer having a low concentration of the first type of dopant and disposed on the semiconductor substrate;
   a second type of dopant channel formed inside the semiconductor layer for integrating, storing, transporting, and removing the generated signal charge;
   a MOSFET (formed in said second type dopant channel in the top of the semiconductor layer) having a gate defining an underlying charge sensing potential well, a first type of dopant source, a first type of dopant drain, and a channel between the source to drain with charge flow which senses the generated signal charge in the charge sensing potential well;
   a feedback amplifier with a gain of G, G being a selectable gain number, having an input connected to the MOSFET source and an output connected to the MOSFET gate;
   a current generator connected in series with the MOSFET source;
   a reset gate on top of a dielectric formed on top of the semiconductor layer;
   a second type of dopant reset drain formed in the top portion of the semiconductor layer; and,
whereby in periodic non-destructive read-out device operation the generated signal charge is integrated and sensed in the charge sensing potential well and subsequently removed by being destructively drained from the charge sensing potential well into the reset drain.

2. The non-destructive read-out device of claim 1 wherein the first type dopant is p-type and the second type dopant is n-type.

3. The non-destructive read-out device of claim 1 wherein the MOSFET has a buried channel.

4. The non-destructive, read-out device of claim 1 wherein the MOSFET has a surface channel.

5. The non-destructive read-out device of claim 1 wherein the MOSFET channel is formed in close proximity to the charge sensing potential well.

6. The non-destructive read-out device of claim 1 wherein the MOSFET channel is formed in tandem with the charge sensing potential well.

7. The non-destructive read-out device of claim 1 wherein the generated signal charge integrated in the charge sensing potential well is an electron charge.

8. The non-destructive read-out device of claim 1 wherein the MOSFET channel source to drain charge flow is a hole charge flow.

9. The non-destructive read-out device of claim 1 wherein the MOSFET source is surrounded by the MOSFET gate.

10. The non-destructive read-out device of claim 1 wherein the MOSFET gate is shaped into a rectangular frame.

11. The non-destructive read-out device of claim 1 wherein the MOSFET gate is doughnut shaped.

12. The non-destructive read-out device of claim 1 wherein the MOSFET drain forms a static potential barrier on a portion of a periphery of the MOSFET gate for confining signal charge in the charge sensing potential well.

13. The non-destructive read-out device of claim 1 wherein the reset gate forms a dynamic potential barrier on a portion of a periphery of the MOSFET gate for confining signal charge in the charge sensing potential well.

14. The non-destructive read-out device of claim 13 wherein applying a non-blocking voltage potential to the reset gate drains the generated signal charge from the charge sensing potential well into the reset drain.

15. The non-destructive read-out device of claim 1 wherein a single non-destructive read-out device is built into a single CMOS imager pixel.

16. The non-destructive read-out device of claim 1 wherein a single non-destructive read-out device is built into a plurality of CCD imager pixels.

17. A method for fabricating a high sensitivity, high speed, and low noise, semiconductor non-destructive read-out device for the conversion of a generated signal charge into an output voltage, the method comprising:
   providing a semiconductor substrate having a first type of dopant;
   forming a semiconductor layer having low concentration of the first type of dopant and disposed on the semiconductor substrate;
   forming a second type of dopant channel in the semiconductor layer for integrating, storing, transporting, and removing the generated signal charge;
   forming a MOSFET in said second type dopant channel (formed in the top semiconductor layer) having a gate defining an underlying charge sensing potential well, a first type of dopant source, a first type of dopant drain, and a channel between the source to drain with charge flow which senses the generated charge in the charge sensing potential well;
   providing a feedback amplifier with a gain of G, G being a selectable gain number, having an input connected to the MOSFET source and an output connected to the MOSFET gate;
   providing a current generator connected in series with the MOSFET source;
   forming a reset gate on top of a dielectric formed top of the semiconductor layer;
   forming a second type of dopant reset drain in the top portion of the semiconductor layer.

18. The method of claim 17 wherein the first type dopant is p-type and the second type dopant is n-type.

19. The method of claim 17 wherein the MOSFET channel is a surface channel.

20. The method of claim 17 wherein the MOSFET channel is a buried channel.

21. The method of claim 17 wherein the MOSFET channel is formed in close proximity to the charge sensing potential well.

22. The method of claim 17 wherein the MOSFET channel is formed in tandem with the charge sensing potential well.

23. The method of claim 17 wherein the MOSFET source is surrounded by the MOSFET gate.

24. The method of claim 17 wherein the MOSFET gate is shaped into a rectangular frame.

25. The method of claim 17 wherein the MOSFET gate is doughnut shaped.

26. The method of claim 17 wherein the MOSFET drain forms a static potential barrier on a portion of a periphery of the MOSFET gate for confining signal charge in the charge sensing potential well.

27. The method of claim 17 wherein the reset gate forms a dynamic potential barrier on a portion of a periphery of the MOSFET gate for confining signal charge in the charge sensing potential well.

28. The method of claim 17 wherein applying a non-blocking voltage potential to the reset gate drains the generated signal charge from the charge sensing potential well into the reset drain.

29. A high sensitivity, high speed, and low noise, semiconductor non-destructive read-out device for the conversion of signal charge into an output voltage having separate locations for charge integration, charge injection, charge transfer, non-destructive charge read-out, and charge removal, the non-destructive read-out device comprising:
a semiconductor substrate having a first type of dopant;
a semiconductor layer with a low concentration of the first type of dopant and disposed on the semiconductor substrate;
a second type of dopant first channel with a first type of dopant channel stops formed inside the semiconductor layer for integration, read-out, transfer, and removal of signal charge;
a MOSFET (formed in said second type dopant channel in the top semiconductor layer) having a gate defining an underlying charge sensing potential well, a first type of dopant source, a first type of dopant drain, and a channel between the source to drain for charge flow which senses the signal charge in the charge sensing potential well;
a feedback amplifier with a gain of G, G being a selectable gain number, having an input connected to the MOSFET source and an output connected to the MOSFET gate;
a current generator connected in series with the MOSFET source;
a reset gate formed on a dielectric formed on top of the semiconductor layer;
a second type of dopant reset drain formed in the top semiconductor layer;
a multiplexer gate formed on a dielectric formed on the top semiconductor layer;
a pair of adjacent CCD transfer gates formed on a dielectric formed on top of the semiconductor layer and defining and controlling the underlying potential well in the first channel with a first type of dopant channel stops; and,
whereby in multi stage non-destructive read-out device operation the signal charge is drained from the first potential well and injected into the charge sensing potential well where it is subsequently sensed, and is subsequently destructively drained from charge sensing potential well into the reset drain.

30. The non-destructive read-out device of claim 29 wherein the first type dopant is p-type and the second type dopant is n-type.

31. The non-destructive read-out device of claim 29 wherein the MOSFET channel is formed in close proximity to the charge sensing potential well.

32. The non-destructive read-out device of claim 29 wherein the MOSFET channel is formed in tandem with the charge sensing potential well.

33. The non-destructive read-out device of claim 29 wherein the MOSFET gate is split into two segments.

34. The non-destructive read-out device of claim 29 wherein the signal charge is an electron charge.

35. The non-destructive read-out device of claim 29 wherein the MOSFET channel source to drain charge flow is a hole charge flow.

36. The non-destructive read-out device of claim 29 wherein the MOSFET source is surrounded by the MOSFET gate.

37. The non-destructive read-out device of claim 29 wherein the MOSFET gate is shaped into a rectangular frame.

38. The non-destructive read-out device of claim 29 wherein the MOSFET gate is doughnut shaped.

39. The non-destructive read-out device of claim 29 wherein the MOSFET drain forms a static potential barrier on a portion of a periphery of the MOSFET gate.

40. The non-destructive read-out device of claim 29 wherein the reset gate forms a dynamic potential barrier on a portion of a periphery of the MOSFET gate for confining signal charge in the charge sensing potential well.

41. The non-destructive read-out device of claim 40 wherein applying a non-blocking voltage potential to the reset gate drains the signal charge from the charge sensing potential well into the reset drain.

42. The non-destructive read-out device of claim 29 wherein the multiplexer gate forms a dynamic potential barrier on a portion of a periphery of the MOSFET gate for confining signal charge in the charge sensing potential well.

43. The non-destructive read-out device of claim 42 wherein opening the multiplexer gate drains the signal charge from the first channel potential well into the charge sensing potential well.

44. The non-destructive read-out device of claim 29 wherein the amplifier provides output drive.

45. The non-destructive read-out device of claim 29 wherein the amplifier optimizes bias conditions on the MOSFET gate.

46. A method for fabricating a high sensitivity, high speed, and low noise, semiconductor non-destructive read-out device for the conversion of a signal charge into an output voltage having separate locations for charge integration, charge transfer, and charge read-out, and charge removal the method comprising:
providing a semiconductor substrate having a first type of dopant;
forming a semiconductor layer with a low concentration the first type of dopant and disposed on the semiconductor substrate;
forming a second type of dopant channel with a first type of dopant channel stops inside the semiconductor layer for integration, read-out, transfer, and removal of the signal charge;
forming a MOSFET in said second type dopant channel in the top semiconductor layer having a gate defining an underlying charge sensing potential well, a first type of dopant source, a first type of dopant drain, and a channel between the source to drain with charge flow which senses the signal charge in the charge sensing potential well;

providing a feedback amplifier with a gain of G, G being a selectable gain number, having an input connected to the MOSFET source and an output connected to the MOSFET gate;

providing a current generator connected in series with the MOSFET source;

forming a reset gate on a dielectric formed on top of the semiconductor layer;

forming a second type of dopant reset drain in second type dopant channel formed in the top portion of the semiconductor layer;

forming a multiplexer gate on a dielectric formed on the top second type dopant channel, located in the top semiconductor layer;

forming a pair of adjacent CCD transfer gates on top of a dielectric formed on the top second type doped channel with a first type of dopant channel stops located in the top semiconductor layer and defining the underlying first channel potential well.

47. The method of claim 46 wherein the first type dopant is p-type and the second type dopant is n-type.

48. The method of claim 46 wherein the MOSFET channel is formed in close proximity to the charge sensing potential well.

49. The method of claim 46 wherein the MOSFET channel is formed in tandem with the charge sensing potential well.

50. The method, of claim 46 wherein the MOSFET has a buried channel between source and drain.

51. The method of claim 46 wherein the MOSFET has a surface channel between source and drain.

52. The method of claim 46 wherein the MOSFET gate is split into two segments.

53. The method of claim 46 wherein the MOSFET source is surrounded by the MOSFET gate.

54. The method of claim 46 wherein the MOSFET gate is shaped into rectangular frame.

55. The method of claim 46 wherein the MOSFET gate is doughnut shaped.

56. The method of claim 46 wherein the MOSFET drain forms a static potential barrier on a portion of a periphery of the MOSFET gate for confining signal charge in the charge sensing potential well.

57. The method of claim 46 wherein the reset gate forms a dynamic potential barrier on a portion of a periphery of the MOSFET gate for confining signal charge in the charge sensing potential well.

58. The method of claim 46 wherein the multiplexer gate forms a dynamic potential barrier on a portion of a periphery of the MOSFET gate for confining signal charge in the charge sensing potential well.

59. A high sensitivity, high speed, and low noise, semiconductor multiple stage non-destructive read-out device comprising an input stage, a selectable number of interior stages, and an end stage, for the conversion of a signal charge into an output voltage, the multiple stage non-destructive read-out device comprising:

an input stage pair of adjacent CCD transfer gates;
an input stage multiplexer gate;
an input stage MOSFET having a gate, a source, a drain, and a channel for sensing the signal charge inside a charge sensing potential well;
an input stage feedback amplifier with a gain of G, G being a selectable gain number, having an input connected to the MOSFET source and an output connected to the MOSFET gate;
an input stage current generator connected in series with the MOSFET source;
an input stage reset gate;
interior stage pairs of adjacent CCD transfer gates;
interior stage multiplexer gates;
interior stage MOSFETs having gates, sources, drains, and charge sensing potential well for sensing the signal charge;
interior stage feedback amplifiers with a gain of G, G being a selectable gain number, having inputs connected to the MOSFET sources and outputs connected to the MOSFET gates;
interior stage current generators connected in series with the MOSFET sources;
interior stage reset gates;
an end stage pair of adjacent CCD transfer gates;
an end stage multiplexer gate;
an end stage MOSFET having a gate, a source, a, drain, and a charge sensing potential well for sensing the signal charge;
an end stage feedback amplifier with a gain of G, G being a selectable gain number, having an input connected to the MOSFET source and an output connected to the MOSFET gate;
an end stage current generator connected in series with the MOSFET source;
an end stage reset gate;
an end stage reset drain; and,
whereby in periodic multiple stage non-destructive read-out device operation the signal charge is injected and sensed in the input stage, subsequently transferred and repeatedly sensed in the interior stages, and subsequently transferred, sensed, and destructively drained in the end stage.

60. A method for forming a high sensitivity, high speed, and low noise, semiconductor multiple stage non-destructive read-out device comprising an input stage, a selectable number of interior stages, and an end stage, for the conversion of a signal charge into an output voltage, the method comprising:

forming an input stage pair of adjacent CCD transfer gates;
forming an input stage multiplexer gate;
forming an input stage MOSFET having a gate, a source, a drain, and a channel for sensing the signal charge inside a charge sensing potential well;
forming an input stage feedback amplifier with a gain of G, G being a selectable gain number, having an input connected to the MOSFET source and an output connected to the MOSFET gate;
forming an input stage current generator connected in series with the MOSFET source;
forming an input stage reset gate;
forming interior stage pairs of adjacent CCD transfer gates;
forming interior stage multiplexer gates;
forming interior stage MOSFETs having gates, sources, drains, and channels for sensing the generated signal charge;
forming interior stage feedback amplifiers with a gain of G, G being a selectable gain number, having inputs connected to the MOSFET sources and outputs connected to the MOSFET gates;
forming interior stage current generators connected in series with the MOSFET sources;

forming interior stage reset gates;
forming an end stage pair of adjacent CCD transfer gates;
forming an end stage multiplexer gate;
forming an end stage MOSFET having a gate, a source, a drain, and a surface or buried channel for sensing the signal charge in a charge sensing potential well;
forming an end stage feedback amplifier with a gain of G, G being a selectable gain number, having an input connected to the MOSFET source and an output connected to the MOSFET gate;
forming an end stage current generator connected in series with the MOSFET source;
forming an end stage reset gate; and, forming an end stage reset drain.

* * * * *